United States Patent [19]

Yamadera et al.

[11] 4,454,219

[45] Jun. 12, 1984

[54] PHOTOSENSITIVE RESIN COMPOSITION COMPRISED OF A POLYMER OBTAINED FROM AN ALIPHATIC AMINO GROUP-CONTAINING MONOMER AS A COMONOMER

[75] Inventors: Takashi Yamadera; Nobuyuki Hayashi, both of Hitachi, Japan

[73] Assignee: Hitachi Chemical Company, Ltd., Tokyo, Japan

[21] Appl. No.: 370,295

[22] Filed: Apr. 20, 1982

[30] Foreign Application Priority Data

Apr. 27, 1981 [JP] Japan .................................. 56-64465
Nov. 28, 1981 [JP] Japan ................................. 56-191260

[51] Int. Cl.³ .............................................. G03C 1/70
[52] U.S. Cl. .................................. 430/281; 430/910; 430/925; 204/159.16; 204/159.18

[58] Field of Search ............... 430/281, 907, 910, 925; 204/159.16, 159.18

[56] References Cited

U.S. PATENT DOCUMENTS 3,961,961 6/1976 Rich ................................ 430/910 X
4,071,425 1/1978 Guarino et al. ............ 204/159.18 X

*Primary Examiner*—John E. Kittle
*Assistant Examiner*—Cynthia Hamilton
*Attorney, Agent, or Firm*—Antonelli, Terry & Wands

[57] ABSTRACT

A photosensitive resin composition comprising (a) a polymer obtained by using an aliphatic amino group-containing monomer as a comonomer, (b) an ethylenic unsaturated compound, (c) a photosensitizer and/or a photosensitizer system and (d) an organic halogen compound shows high photosensitivity and excellent resistance to plating and is usable as plating resists or etching resists.

22 Claims, No Drawings

PHOTOSENSITIVE RESIN COMPOSITION COMPRISED OF A POLYMER OBTAINED FROM AN ALIPHATIC AMINO GROUP-CONTAINING MONOMER AS A COMONOMER

This invention relates to a photosensitive resin composition, more particularly to a photosensitive resin composition for producing etching resists and plating resists having excellent adhesion and high sensitivity usable in the production of printed wiring boards, metal precision working, and the like.

In the field of the printed wiring board production, metal precision wording, and the like, it has been known to use photosensitive resin compositions and photosensitive elements produced by using said photosensitive resin compositions as resist materials in modification of substrates using chemical and electrochemical techniques such as etching, plating, and the like. As the photosensitive elements, there are widely used those obtained by laminating a layer of a photosensitive resin composition on a supporting layer. These photosensitive resin compositions and photosensitive elements obtained by using said resin compositions are required to have good properties in resistance to chemicals and adhesion to a substrate enough to withstand when used as etching resists or plating resists and also to have sufficient photosensitivity for practical use.

In the field of printed wiring board production, since circuits are recently developed to have higher density, the photosensitive resin compositions and photosensitive elements used therefore are required to have more excellent adhesion to substrates. Further, from the viewpoint of shortening the process, the photosensitive resin compositions and photosensitive elements are require to have higher photosensitivity.

One general method for obtaining a photosensitive resin composition having higher photosensitivity particularly in the polymerizable system comprising unsaturated compound and free radial generating initiators is to increase the photosensitivity of the unsaturated compounds. For such a purpose, various unsaturated compounds have been searched. In general, polyacrylates of polyhydric alcohols are widely used. Among them, acrylates having a polyether linkage, particularly those having a structure of polyethylene glycol are effective as high sensitive acrylates. Examples of such acrylates are tetraethylene glycol diacrylate, nonaethylene glycol diacrylate, etc., which are available commercially, e.g., NK Ester A-4G, A-9G manufactured by Shin-Nakamura Kagaku K.K., Japan. In some cases, a polyethylene glycol structure is introduced into other components other than unsaturated compounds for attaining the same purpose. The use of such compounds for such a purpose is disclosed, for example, in Japanese Patent Appln Kokoku (Post-Exam Publn) No. 33801/80.

Such compounds as acrylates having a polyethylene glycol structure are effective for increasing the sensitivity of a photosensitive resin composition or a photosensitive element using said resin composition, but have an disadvantage in that resistance to plating of a resist obtained therefrom is undesirably lowered. Therefore, the usable amount of such compounds as acrylates having a polyethylene glycol structure is limited when resistance to plating is required and thus the sensitivity is lowered depending on the reduced amount of the acrylates.

In order to avoid such a disadvantage, the use of an adhesion promoting agent such as 1,2,3-benzotriazole is disclosed in Japanese Patent Appln Kokoku (Post-Exam Publn) No. 9177/75. The effect of such an adhesion promoting agent is explained in that the adhesion promoting agent in a resin composition is oriented to a substrate, such as copper surface, being in direct contact with the surface of the composition coated or laminated on the substrate by a conventional method and foams a single molecule layer which strengthens the adhesion between the substrate and the resin composition or its cured product. The use of such an adhesion promoting agent is effective in some cases, but sometimes gives bad influences on later procedures since a stiff film is formed on the surface of substrate by the adhesion promoting agent itself. For example, in the case of benzotriazole, since a photosensitive layer discolors the substrate surface remarkably with the lapse of time, there are disadvantages in that when the photosensitive layer on the unexposed surface areas are removed by a technique such as development or the like, said surface of the substrate has etching resistance or is lessened in deposition of plating metal. As mentioned above, the use of the adhesion promoting agent arises some problems.

The present inventors have studied to remove the above-mentioned disadvantages and accomplished this invention.

This invention provides a photosensitive resin composition having sufficient adhesion and resistance to plating without using an adhesion promoting agent.

In accordance with this invention, there is provided a photosensitive resin composition comprising (a) a film forming property imparting polymer obtained by using as a comonomer, a monomer containing an aliphatic amino group represented by the formula:

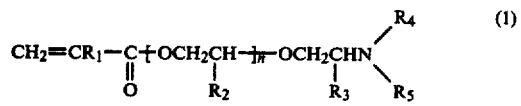

wherein $R_1$, $R_2$ and $R_3$ are independently hydrogen or a methyl group; $R_4$ and $R_5$ are independently an alkyl group having 1 to 4 carbon atoms, or $R_4$ and $R_5$ may form a saturated alicyclic 4- to 7-membered ring together with the nitrogen atom; and n is zero or an integer of 1 to 3, (b) an ethylenic unsaturated compound, (c) a photosensitizer and/or a photosensitizer system capable of forming free radicals by actinic light, and (d) an organic halogen compound.

One of features of this invention is to use a monomer of the formula (1) for giving the polymer (a) and an organic halogen compound (d) as essential components.

The polymer (a) which can impart film forming properties to the resin composition can easily be prepared by a conventional vinyl polymerization using as comonomers at least one aliphatic amino group-containing monomer of the formula (1) and one or more other vinyl polymerizable monomers.

Examples of other vinyl polymerizable monomers are methyl methacrylate, butyl methacrylate, lauryl methacrylate, ethyl acrylate, methyl acrylate, styrene, vinyltoluene, α-methylstyrene, 2-hydroxyethyl methacrylate, 2-hydroxyethyl acrylate, acrylamide, etc.

As the aliphatic amino group-containing monomers of the formula (1), those having a basic amine structure is more preferable than nucleophilic amine structure. This is because the aliphatic amino groups introduced into side chains of the polymer (a) should form quaternary ammonium salts in the composition by immediately bonding to protons produced by irradiation of actinic light. Therefore, aliphatic alkylamines having proper steric hindrance are preferable. Taking these things into consideration, $R_4$ and $R_5$ in the formula (1) are preferably independently a methyl group, an ethyl group, a propyl group, an isopropyl group, n-butyl group, or an isobutyl group, or $R_4$ and $R_5$ together with the nitrogen atom may preferably form a saturated alicyclic ring such a piperidine ring, etc. More preferable examples of $R_4$ and $R_5$ in the formula (1) are independently a methyl group and an ethyl group.

The length of the alkylene group in the aliphatic amino group-containing monomer of the formula (1) can be selected depending on purposes. The longer alkylene group length gives better photosensitivity. On the other hand, the presence of such an alkylene-ether linkage lowers resistance to plating as in the case of the polyethylene glycol structure.

Taking these things into consideration, a longer alkylene group is not necessary and "n" in the formula (1) is preferably zero or an integer of 1 to 3. Particularly, dialkylaminoethyl acrylates and dialkylaminoethyl methacrylates are preferable. More preferable examples of the monomers of the formula (1) which can easily available commercially are N,N-dimethylaminoethyl methacrylate, N,N-dimethylaminoethyl acrylate, N,N-diethylaminoethyl methacrylate, and the like.

The content of the aliphatic amino group-containing monomer in the polymer (a) is preferably 0.1 to 10% by weight, more preferably 0.2 to 5% by weight. It is a very surprising thing that even if the content of the monomer of the formula (1) is 1% by weight or less, sufficient effect can be obtained.

As the organic halogen compound (d), there can preferably be used those which can easily liberate halogen radicals by actinic light or easily liberate halogen radicals by chain transfer. Among them, aliphatic halogen compounds having rather weak carbon-halogen bond strength, particularly aliphatic halogen compounds having two or more halogen atoms bonded to one carbon atom, and organic bromine compounds are preferable.

Examples of the organic halogen compounds (d) are carbon tetrachloride, chloroform, bromoform, iodoform, methylene chloride, 1,1,1-trichloroethane, methylene bromide, methylene iodide, carbon tetrabromide, 1,1,2,2-tetrabromoethane, pentabromoethane, tribromoacetophenone, bis-(tribromomethyl) sulfone, tribromomethylphenyl sulfone, vinyl chloride, chlorinated olefins, and the like. These organic halogen compounds can be used alone or as a mixture thereof. Among organic halogen compounds (d), those having a tribromomethyl group give more preferable effects.

The amount of the organic halogen compounds is not particularly limited but preferably 0.2 to 10 moles, more preferably 0.5 to 3 moles per mole of the aliphatic amino group-containing monomer of the formula (1).

In this invention, all reactions taking place in the photosensitive resin composition are not clear but there seem to take place the following reactions: that is, halogen radicals produced directly or indirectly from the organic halogen compound by irradiation with actinic light form hydrogen halide by withdrawing hydrogen from a hydrogen donor, and said hydrogen halide reacts with the alkylamino groups in side chains of the polymer (a) to form quaternary ammonium salts. These can be represented by the following equations:

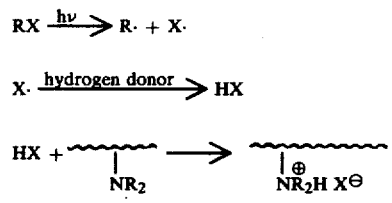

Thus, polar groups having an ionic structure are newly introduced into side chains of the polymer (a) by irradiation with actinic light, which seems to result in improving the adhesion in this invention.

Generally speaking, the presence of polar groups in side chains of the polymer (a) gives physical adhesion to the substrate and the cured material, but does not always show such an effect against a usual acidic or alkaline etching solution and a plating solution. This is particularly remarkable in the case of carrying out plating. For example, a polymer (a) having carboxyl groups in side chains has sufficient resistance to an acidic etching solution but has remarkably lowered resistance to an alkaline copper pyrophosphate plating bath. This tendency becomes more remarkable in the above-mentioned system containing polyethylene glycol acrylates. In such a system, in fact, the saturated water absorption of cured material in water increases proportionally to the content of polar groups and the content of polyethylene glycol series acrylates, which becomes a main cause for lowering resistance to plating. Although polar groups, particularly groups having ionic structure are expected to be produced in cured material derived from the photosensitive resin composition comprising the polymer (a) and the organic halogen compounds (d) and photosensitive element obtained by using said resin composition, it is a very surprising thing that resistance to plating is improved in this invention.

Further, that the photosensitivity of the photosensitive resin composition is increased is also an unexpected effect in this invention; this also shows that this invention is very useful.

As the ethylenic unsaturated compound (b), conventional ones singly or as a mixture thereof can be used. From the viewpoint of high photosensitivity, the use of acrylate monomers or methacrylate monomers is preferable. Particularly preferable examples of acrylate monomers or methacrylate monomers are polyacrylates or polymethacrylates of polyhydric alcohols such as trimethylolpropane triacrylate, pentaerythritol triacrylate, 1,6-hexanediol diacrylate, 2,2-bis(4-methacryloxyethoxyphenyl)propane, 2,2-bis(4-acryloxyethoxyphenyl)propane, dipentaerythritol pentacrylate, trimethylolpropane trimethacrylate, etc.; acrylic acid or methacrylic acid adduct of trimethylolpropane triglycidyl ether; epoxy acrylates or methacrylates such as acrylic acid or methacrylic acid adducts of bisphenol A-epichlorhydrin epoxy resins; low molecular weight unsaturated polyesters such as condensates of phthalic anhydride-neopentyl glycol-acrylic acid (1:2:2 molar ratio), etc. Further, there can also preferably be used polyethylene glycol series acrylates or methacrylates such as diethylene glycol diacrylate, tetraethylene glycol diacrylate, nonaethylene glycol diacrylate, tetraethylene glycol dimethacrylate, polyethylene glycol (molecular weight about 400) diacrylate, etc., but the amount of these compounds should be determined in a range so as to maintain resistance to plating. A combined use of these with the above-mentioned polyhydric alcohol polyacrylates is particularly preferable.

As the photosensitizer or the photosensitizer system (c) capable of forming free radicals by actinic light, there can be used conventional ones alone or as a mixture thereof.

Examples of the photosensitizers are benzophenone and its deriratives such as benzophenone, p,p-dimethylaminobenzophenone, p,p-diethylaminobenzophenone, p,p-dichlorobenzophenone, etc., and a mixture thereof; anthraquinones such as 2-ethylanthraquinone, t-butylanthraquinone, etc.; 2-chlorothioxanthone, benzoin isopropyl ether, benzoin ethyl ether, benzyl, 2,4,5-triarylimidazole dimer, etc.

The term "photosensitizer system" is used herein to mean a combination of a photosensitizer and a sensitizing assistant. Examples of such photosensitizer system are combinations of 2,4,5-triarylimidazole dimer and 2-mercaptobenzoquinazole, leucocrystal violet, tris(4-diethylamino-2-methylphenyl)methane and the like. It is possible to use such type of additives which, although having no photoinitiating properties per se, can provide a photosensitizer system with even better photoinitiating performance as a whole when used in combination with above-mentioned materials. Typical examples of such additives are tertiary amines such as triethanolamine when used in combination with benzophenone.

In the photosensitive resin composition of this invention, the polymer (a) is preferably used in an amount of 30 to 80 parts by weight and the ethylenic unsaturated compound (b) is preferably used in an amount of 70 to 20 parts by weight, the total being 100 parts by weight. To 100 parts by weight of the components (a) and (b), 0.5 to 10 parts by weight of the photosensitizer and/or photosensitizer system (c) capable of forming free radicals by actinic light and 0.2 to 10 parts by weight of the organic halogen compound (d) are preferably added to give a photosensitive resin composition. There is no particular limit to the order to mixing of the components (a), (b), (c) and (d) and the mixing method thereof.

The photosensitive resin composition of this invention may further contain one or more conventional dyes, plasticizers, pigments, fire retardants, stabilizers and the like, if necessary, as well as adhesion promoting agents.

This invention is illustrated by way of the following Examples, in which all parts and percents are by weight unless otherwise specified.

EXAMPLE 1

(I) Each film forming property imparting polymer containing an aliphatic amino group (hereinafter referred to as "polymer") was synthesized by the following method.

TABLE 1

| Monomer mixture No. | M-1 | M-2 | M-3 | M-4 |
|---|---|---|---|---|
| Methyl methacrylate | 98 | 96 | 97 | 97.5 |
| Ethyl acrylate | 2 | 2 | 2 | 2 |
| Dimethylaminoethyl methacrylate | — | — | 1 | 0.5 |
| Methacrylic acid | — | 2 | — | — |

Note
Total weight was 400 g in each case.

In a 1-liter flask, 250 g of toluene and 150 g of each monomer mixture of M-1 to M-4 out of 400 g shown in Table 1 were placed and heated to 85° C. while passing a nitrogen stream. Subsequently, a mixed solution containing 250 g of the residual monomer, 150 g of toluene, and 0.56 g of azobisisobutyronitrile was added to the flask dropwise in 3 hours, while maintaining the temperature at 85° C. After completion of the addition, the flask was maintained at that temperature for 4 hours. Then a solution obtained by dissolving 0.28 g of azobisisobutyronitrile in 75 g of toluene was added to the flask dropwise in 30 minutes. After completion of the addition, the temperature was maintained at that level for 4 hours. Then, the reaction solution was diluted with 75 g of toluene and 75 g of methyl ethyl ketone to give each other polymer solution P-1 to P-4 with non-volatile content of 36–38%. Properties of the resulting polymer solutions are shown in Table 2.

TABLE 2

| Polymer solution No. | P-1 | P-2 | P-3 | P-4 |
|---|---|---|---|---|
| Non-volatile content[*1] (%) | 36.2 | 37.5 | 37.7 | 38.2 |
| Gardner viscosity (25° C.) | $Z_1-Z_2$ | $Z_2$ | $Z_3^+$ | $Z_3-Z_4$ |
| Reduced viscosity[*2] $\eta sp/c$ | 0.33 | 0.31 | 0.33 | 0.34 |

Note to Table 2:
[*1]Data after dried at 108° C. for 3 hours.
[*2]Using a Cannon-Fenske type capillary viscometer (viscometer No. 25, C = 00301), a sample prepared by dissolving 0.25 g of a polymer (based on dry basis) in 100 ml of methyl ethyl ketone was measured at 30° C.

(II) Using the polymer solutions P-1 to P-4, photosensitive resin compositions V-1 to V-6 as shown in Table 3 were prepared.

TABLE 3

| Composition No. (in parts) | V-1 | V-2 | V-3 | V-4 | V-5 | V-6 |
|---|---|---|---|---|---|---|
| P-1 | 165.7 | — | — | — | 165.7 | — |
| P-2 | — | 157.1 | — | — | — | — |
| P-3 | — | — | 160.0 | — | — | 160.0 |
| P-4 | — | — | — | 159.2 | — | — |
| Trimethylolpropane triacrylate | 25 | 25 | 25 | 25 | 25 | 25 |
| Tetraethylene glycol diacrylate | 15 | 15 | 15 | 15 | 15 | 15 |
| Benzophenone | 4.5 | 4.5 | 4.5 | 4.5 | 4.5 | 4.5 |
| Michler's ketone | 0.5 | 0.5 | 0.5 | 0.5 | 0.5 | 0.5 |
| Methylene-bis(1,1-di-t-butyl-4,4'-dimethylphenol) | 0.5 | 0.5 | 0.5 | 0.5 | 0.5 | 0.5 |
| Carbon tetrabromide | 2.5 | 2.5 | 2.5 | 2.5 | — | — |
| Victoria pure blue | 0.08 | 0.08 | 0.08 | 0.08 | 0.08 | 0.08 |
| Leucocrystal violet | 0.5 | 0.5 | 0.5 | 0.5 | 0.5 | 0.5 |
| Methyl ethyl ketone | 40 | 40 | 40 | 40 | 40 | 40 |

Each photosensitive resin composition (varnish) thus prepared (V-1 to V-6) was uniformly coated on a poly-(ethylene terephthalate) film having a thickness of 25 $\mu$m so as to give a coating film of 25 $\mu$m thick after dried. After dried at 80° C. for 5 minutes, there was obtained each photosensitive element as shown in Table 4 (F-1 to F-6). In Table 4, F-3 and F-4 are Examples of this invention and others are Comparative Examples.

TABLE 4

| Element No. | F-1 | F-2 | F-3 | F-4 | F-5 | F-6 |
|---|---|---|---|---|---|---|
| Varnish used (Composition No.) | V-1 | V-2 | V-3 | V-4 | V-5 | V-6 |
| Film thickness ($\mu$m) | 25 | 25 | 25 | 25 | 25 | 25 |

(III) Degrees of sensitivity of individual photosensitive elements F-1 to F-6 thus obtained were evaluated as follows.

Each photosensitive element (F-1 to F-6) was laminated on a copper surface of a copper-clad laminate, previously cleaned with polishing using a nylon brush, by means of a Hitach high temperature laminator, the temperature of rubber roll being 165° C. The thus obtained photosensitive element-laminated copper-clad laminate was allowed to stand at room temperature for 30 minutes, and then exposed to ultraviolet light from a 2 KW ultra-high pressure mercury lamp (HMW-2000, mfd. by ORC Seisakusho, Ltd.) through a gray-scale negative (Step Tablet No. 2 (21 steps), mfd. by Eastman Kodak Co., Ltd.) for 15 seconds. After exposure to light, the element was allowed to stand for more than 30 minutes, and then the poly(ethylene terephthalate) film was peeled off, followed by development using 1,1,1-trichloroethane. The degree of sensitivity was evaluated by the number of steps of the step tablet not washed out by the development (hereinafter referred to as "ST step number"). The results are shown in Table 5.

TABLE 5

| Element No. | ST step number* |
|---|---|
| F-1 | 6.0 |
| F-2 | 6.5 |
| F-3 | 8.1 |
| F-4 | 7.9 |
| F-5 | 5.2 |
| F-6 | 6.6 |

Note
*The figure at the first decimal place of ST step number means a value of degree of swelling of the uppermost cured material when evaluated by 10 grades.

As is clear from Table 5, the systems of the present invention which contain both the polymer (a) and the organic halogen compound (d) (i.e., F-3 and F-4) show high ST step numbers, which means that F-3 and F-4 a have high degree of sensitivity. This means, for example, that the time in second necessary for exposing so as to obtain the same ST step number can be reduced in 30 to 60% in the cases of F-3 and F-4 compared with the case of F-1.

(IV) Using the same procedures as described in above (III), a photosensitive element-laminated copper-clad laminate was exposed to ultraviolet light through a negative having a prescribed circuit pattern and developed so as to make the ST step number 8 steps. Then, the developed element was copper plated in a copper pyrophosphate plating bath, followed by non-gloss solder plating. Pretreatments and plating conditions were as shown in Table 6.

TABLE 6

| | Contents of treatment | |
|---|---|---|
| Copper plating pretreatment | Newtraclean 68 (mfd. by Shipley Co.) ↓ | 50° C. 2 min. |
| | Washing with water ↓ | 30 sec. |
| | Aq. soln. of ammonium persulfate (250 g/l, RT) ↓ | 1 min. |
| | Washing with water ↓ | 30 sec. |
| | dil H$_2$SO$_4$ (10%) ↓ | 30 sec. |
| | Washing with water | 30 sec. |
| Copper pyrophosphate plating | Bath temperature (°C.) Current density (A/dm$^2$) Current passing time (min) | 55 3.2 45 |
| Solder plating pretreatment | Washing with water ↓ | 1 min. |
| | Borofluoric acid (20% aq. soln.) | 2 min. |
| Non-gloss solder | Bath temperature (°C.) Current density (A/dm$^2$) | 23 2.68 |

TABLE 6-continued

| | Contents of treatment | |
|---|---|---|
| plating | Current passing time (min) | 15 |

After plating, surface appearance was observed by the naked eye and evaluated as shown in Table 7.

TABLE 7

| Element No. | Plating evaluation |
|---|---|
| F-1 | ⓐ |
| F-2 | Δ |
| F-3 | ○ |
| F-4 | ○ |
| F-5 | ⓐ |
| F-6 | ⓐ -○⁻ |

Standards of evaluation:
○ No plating penetration.
○⁻ Plating around the circuit was discolored.
ⓐ Plating solution was slightly penetrated.
Δ Plating penetration took place slightly.
× Plating penetration took place remarkably.

COMPARATIVE EXAMPLE 1

A composition was prepared as follows.

| Ingredients | Parts |
|---|---|
| P-1 | 165.7 |
| Trimethylolpropane triacrylate | 35 |
| Tetraethylene glycol diacrylate | 5 |
| Benzophenone | 4.5 |
| Michler's ketone | 0.5 |
| Methylene-bis(1,1-di-t-butyl-4,4'-dimethylphenol) | 0.5 |
| Carbon tetrabromide | 2.5 |
| Victoria pure blue | 0.08 |
| Leucocrystal violet | 0.5 |
| Methyl ethyl ketone | 40 |

In this Comparative Example 1, the amounts of trimethylolpropane triacrylate and tetraethylene glycol diacrylate were changed and particularly the proportion of the latter was lowered remarkably.

Using the same procedures as described in Example 1, ST step number and plating evaluation were obtained as shown in Table 8.

TABLE 8

| Element No. | ST step number | Plating evaluation |
|---|---|---|
| F-1 | 6.0 | ⓐ |
| F-3 | 8.1 | ○ |
| Comparative Example 1 | 4.2 | ○⁻ |

As is clear from Table 8, plating properties can be improved by reducing the amount of tetraethylene glycol diacrylate to a low level but the degree of sensitivity is lowered reversely.

EXAMPLE 2

Polymers were synthesized in the same manner as described in Example 1, (I), using the following aliphatic amino group-containing monomers.

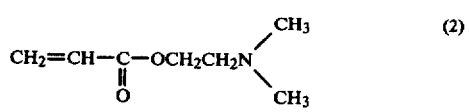

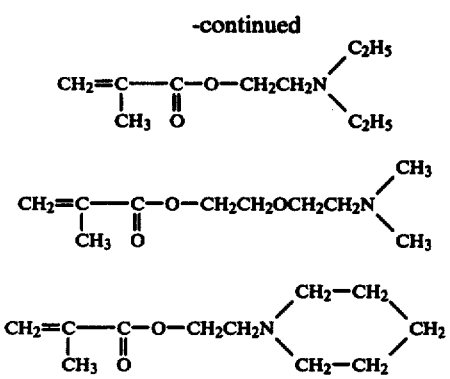

As to the compound (2), that obtained in the market was used as it was. As to the other compounds, these were synthesized by a known method using the corresponding alkylamino alcohols and methacrylic acid or acrylic acid. The compositions of raw materials for producing the polymers were as follows:

| Ingredients | Parts |
| --- | --- |
| Methyl methacrylate | 96 |
| Ethyl acrylate | 2 |
| Acrylamide | 1 |
| Monomer of the formula (2), (3), (4) or (5) | 1 |

The polymers obtained had reduced viscosities ($\eta sp/c$) in the range of 0.30 to 0.33. Using these polymers, the following photosensitive resin compositions were prepared.

| Ingredients | Parts |
| --- | --- |
| Polymer containing the monomer unit of (2), (3), (4) or (5) | 60 |
| Pentaerythritol triacrylate | 30 |
| Tetraethylene glycol diacrylate | 10 |
| Benzophenone | 4.5 |
| Michler's ketone | 0.5 |
| Methylene-bis(1,1-di-t-butyl-4,4'-dimethylphenol) | 0.6 |
| Carbon tetrabromide | 1.5 |
| Pentabromoethane | 0.5 |
| Leucocrystal violet | 0.3 |
| Aizen Spilon Green | 0.3 |
| Methyl ethyl ketone | 40 |

Using the same procedures as described in Example 1 (II), photosensitive elements having a resin film thickness of 50 μm after dried on a poly(ethylene terephthalate) film were produced. The resulting photosensitive elements were exposed to ultraviolet light for 20 seconds, followed by development with 1,1,1-trichloroethane, in the same manner as described in Example 1 (III). ST step numbers were listed in Table 9. For comparison, a photosensitive element obtained by using P-1 containing no aliphatic amino group as the polymer was also tested (Comparative Example 2) and the results were also listed in Table 9.

TABLE 9

| Element No. | Aliphatic amino group-containing monomer in the polymer | ST step number |
| --- | --- | --- |
| F-7 | Formula (2) | 8.3 |
| F-8 | Formula (3) | 8.6 |
| F-9 | Formula (4) | 8.9 |

TABLE 9-continued

| Element No. | Aliphatic amino group-containing monomer in the polymer | ST step number |
| --- | --- | --- |
| F-10 | Formula (5) | 8.3 |
| Comparative Example 2 | None | 6.5 |

EXAMPLE 3

The same procedures as described in Example 1 (I) P-3 were repeated except for changing the amount of azobisisobutyronitrile to 0.42 g to give a polymer P-5 having a reduced viscosity ($\eta sp/c$) of 0.39. Using this P-5, a photosensitive resin composition V-11 was prepared using ingredients as shown below. For comparison, a polymer obtained by using the same monomer mixture as M-1 in Table 1 in Example 1 and the same sythesis method as described in P-5, having a reduced viscosity ($\eta sp/c$) of 0.40 was used (polymer P-6, Comparative Example 3).

| Ingredients | V-11 Parts | Comparative Example 3 Parts |
| --- | --- | --- |
| P-5 | 50 (dry basis) | — |
| P-6 | — | 50 (dry basis) |
| Pentaerythritol triacrylate | 38 | 38 |
| Polyethylene glycol (M.W. about 400) diacrylate | 10 | 10 |
| t-Butylanthraquinone | 3.5 | 3.5 |
| Methylene-bis(1,1-di-t-butyl-4,4'-dimethylphenol) | 0.5 | 0.5 |
| Tribromomethylphenyl sulfone | 3.5 | 3.5 |
| Victoria pure blue | 0.05 | 0.07 |
| Leucocrystal violet | 0.3 | 0.3 |
| Methyl ethyl ketone | 40 | 40 |

The compositions of V-11 and Comparative Example 3 were respectively coated on a copper-clad laminate previously cleaned with polishing so as to give a film thickness of 50 μm after dried. After dried at 80° C. for 10 minutes, the surface was covered with a poly(ethylene terephthalate) film (25 μm thick) and exposed to ultraviolet light from a 2 kW ultra-high pressure mercury lamp for 25 seconds through a Step Tablet (21 steps, mfd. by Eastman Kodak Co., Ltd.). After allowed to stand for 30 minutes, the resulting element was developed with 1,1,1-trichloroethane. ST Step numbers after development are shown in Table 10.

TABLE 10

|  | ST Step number |
| --- | --- |
| V-11 | 7.8 |
| Comparative Example 3 | 5.9 |

As is clear from Table 10, the aliphatic amino group in the polymer (a) shows a great effect on improving the sensitivity.

As mentioned above, the photosensitive composition of this invention has high degree of sensitivity and excellent resistance to plating, so that it has properties suitable for use as plating resists or etching resists.

What is claimed is:

1. A solvent developable photosensitive resin composition consisting essentially of (a) a film forming property imparting polymer obtained by using as a comonomer in an amount of 0.1 to 10% by weight, a monomer containing an aliphatic amino group represented by the formula:

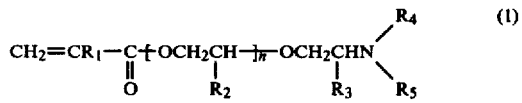

wherein $R_1$, $R_2$ and $R_3$ are independently hydrogen or a methyl group; $R_4$ and $R_5$ are independently an alkyl group having 1 to 4 carbon atoms, or $R_4$ and $R_5$ may form a saturated alicyclic 4- to 7-membered ring together with the nitrogen atom; and n is zero or an integer of 1 to 3, (b) an ethylenic unsaturated compound other than the monomer represented by formula (1), (c) a photosensitizer and/or a photosensitizer system capable of forming free radicals by actinic light, and (d) an organic halogen compound capable of liberating halogen radicals by exposure to actinic light or by chain transfer.

2. A composition according to claim 1, wherein the polymer of the component (a) is derived from the monomer of the formula (1) in an amount of 0.2 to 5% by weight.

3. A composition according to claim 1 or 2, wherein the monomer of the formula (1) is a N,N-dialkylaminoethyl acrylate or a N,N-dialkylaminoethyl methacrylate.

4. A composition according to claim 2, wherein the monomer of the formula (1) is dimethylaminoethyl methacrylate, dimethylaminoethyl acrylate, or diethylaminoethyl methacrylate.

5. A composition according to claim 1, wherein the component (d) is an aliphatic halogen compound.

6. A composition according to claim 5, wherein the aliphatic halogen compound has at least one carbon atom which is bonded to two or more halogen atoms.

7. A composition according to claim 1, wherein the component (d) is an organic bromine compound.

8. A composition according to claim 1, wherein the component (d) is an organic halogen compound having a tribromomethyl group.

9. A composition according to claim 1, wherein the component (b) is an acrylate or methacrylate monomer.

10. A composition according to claim 1, wherein the amount of the component (a) is 30 to 80 parts by weight, the amount of the component (b) is 70 to 20 parts by weight, the total being 100 parts by weight, and the amount of the component (c) is 0.5 to 10 parts by weight and the amount of the component (d) is 0.2 to 10 parts by weight, each (c) and (d) being based on 100 parts by weight of the total of (a) and (b).

11. A composition according to claim 1 or claim 10, wherein the component (a) is derived from the monomer of the formula (1) and one or more comonomers selected from the group consisting of methyl methacrylate, butyl methacrylate, lauryl methacrylate, ethyl acrylate, methyl acrylate, styrene, vinyltoluene, α-methylstyrene, 2-hydroxyethyl methacrylate, 2-hydroxyethyl acrylate and acrylamide in an amount of 99.9 to 90% by weight.

12. A photosensitive element comprising a support film and formed on said support film a layer of a solvent developable photosensitive resin composition consisting essentially of (a) a film forming property imparting polymer obtained by using as a comonomer in an amount of 0.1 to 10% by weight, a monomer containing an aliphatic amino group represented by the formula:

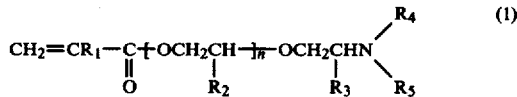

wherein $R_1$, $R_2$ and $R_3$ are independently hydrogen or a methyl group; $R_4$ and $R_5$ are independently an alkyl group having 1 to 4 carbon atoms, or $R_4$ and $R_5$ may form a saturated alicyclic 4- to 7-membered ring together with the nitrogen atom; and n is zero or an integer of 1 to 3, (b) an ethylenic unsaturated compound other than the monomer represented by formula (1), (c) a photosensitizer and/or a photosensitizer system capable of forming free radicals by actinic light, and (d) an organic halogen compound capable of liberating halogen radicals by exposure to actinic light or by chain transfer.

13. A photosensitive element according to claim 12, wherein the amount of the component (a) is 30 to 80 parts by weight, the amount of the component (b) is 70 to 20 parts by weight, the total being 100 parts by weight, and the amount of the component (c) is 0.5 to 10 parts by weight and the amount of the component (d) is 0.2 to 10 parts by weight, each (c) and (d) being based on 100 parts by weight of the total of (a) and (b).

14. A photosensitive element according to claim 12, wherein the monomer of the formula (1) is a N,N-dialkylaminoethyl acrylate or a N,N-dialkylaminoethyl methacrylate.

15. A photosensitive element according to claim 12, wherein the component (d) is an aliphatic halogen compound.

16. A photosensitive element according to claim 12, wherein the polymer of the component (a) is derived from the monomer of the formula (1) in an amount of 0.2 to 5% by weight.

17. A photosensitive element according to claim 12, wherein the monomer of the formula (1) is dimethylaminoethyl methacrylate, dimethylaminoethyl acrylate, or diethylaminoethyl methacrylate.

18. A photosensitive element according to claim 15, wherein the aliphatic halogen compound has at least one carbon atom which is bonded to two or more halogen atoms.

19. A photosensitive element according to claim 12, wherein the component (d) is an organic bromine compound.

20. A photosensitive element according to claim 12, wherein the component (d) is an organic halogen compound having a tribromomethyl group.

21. A photosensitive element according to claim 12, wherein the component (b) is an acrylate or methacrylate monomer.

22. A photosensitive element according to claim 12 or claim 13, wherein the component (a) is derived from the monomer of the formula (1) and one or more comonomers selected from the group consisting of methyl methacrylate, butyl methacrylate, lauryl methacrylate, ethyl acrylate, methyl acrylate, styrene, vinyltoluene, α-methylstyrene, 2-hydroxyethyl methacrylate, 2-hydroxyethyl acrylate and acrylamide in an amount of 99.9 to 90% by weight.

* * * * *